United States Patent
Mayder et al.

(10) Patent No.: US 8,710,623 B1
(45) Date of Patent: Apr. 29, 2014

(54) INTEGRATED CIRCUIT HAVING A DISCRETE CAPACITOR MOUNTED ON A SEMICONDUCTOR DIE

(75) Inventors: Romi Mayder, San Jose, CA (US); Mark A. Alexander, San Francisco, CA (US); Howard Johnson, Twisp, WA (US)

(73) Assignee: Xilinx, Inc., San Jose, CA (US)

( * ) Notice: Subject to any disclaimer, the term of this patent is extended or adjusted under 35 U.S.C. 154(b) by 293 days.

(21) Appl. No.: 12/949,518

(22) Filed: Nov. 18, 2010

(51) Int. Cl.
*H01L 21/02* (2006.01)

(52) U.S. Cl.
USPC .......................................................... 257/532

(58) Field of Classification Search
USPC .......................................................... 257/532
See application file for complete search history.

(56) References Cited

U.S. PATENT DOCUMENTS

| | | | |
|---|---|---|---|
| 5,811,868 A | 9/1998 | Bertin et al. | |
| 6,876,554 B1 * | 4/2005 | Inagaki et al. | 361/763 |
| 7,327,030 B2 | 2/2008 | Lam | |
| 7,619,441 B1 * | 11/2009 | Rahman et al. | 326/38 |
| 2005/0017333 A1 | 1/2005 | Bohr | |
| 2007/0194876 A1 | 8/2007 | Lim et al. | |
| 2007/0205486 A1 | 9/2007 | Shioga et al. | |
| 2010/0308435 A1 | 12/2010 | Nowak et al. | |
| 2011/0115097 A1 | 5/2011 | Shau | |
| 2012/0176751 A1 | 7/2012 | Sakai et al. | |
| 2012/0181658 A1 | 7/2012 | Mohammed et al. | |

OTHER PUBLICATIONS

Specification and drawings from U.S. Appl. No. 13/042,132, filed Mar. 7, 2011, DeBaets.

* cited by examiner

*Primary Examiner* — Matthew W Such
*Assistant Examiner* — Robert Carpenter
(74) *Attorney, Agent, or Firm* — LeRoy D. Maunu; Lois D. Cartier

(57) ABSTRACT

Integrated circuits are fabricated with mounted discrete capacitors. Bond pads and land pads are fabricated on a semiconductor wafer. Discrete capacitors are mounted on the semiconductor wafer with flexible adhesive. The flexible adhesive accommodates a difference in thermal expansion between the discrete capacitors and the semiconductor wafer. The land pads are electrically coupled to the electrodes of the discrete capacitors. The semiconductor wafer is separated into multiple semiconductor dice. The semiconductor dice are mounted in respective packages. The bond pads on each semiconductor die are electrically coupled to the interconnect terminals of the respective package.

12 Claims, 4 Drawing Sheets

INTEGRATED CIRCUIT HAVING A DISCRETE CAPACITOR MOUNTED ON A SEMICONDUCTOR DIE

FIELD OF THE INVENTION

One or more embodiments generally relate to integrated circuits, and more particularly to fabricating integrated circuits including discrete capacitors.

BACKGROUND

A power supply network and a ground network provide power to an integrated circuit. During operation of a digital integrated circuit, switching in the digital logic creates spikes in the current demand from the power supply network and the ground network. These current spikes create power supply fluctuations across the inductance of the power supply network and ground fluctuations across the inductance of the ground network. These fluctuations are commonly known as "simultaneously switching output noise," or SSO, when they arise from currents circulating specifically through a digital logic output. These fluctuations are also commonly known as "power and ground rail collapse" when they arise due to currents otherwise circulating generally within a digital integrated circuit. The power supply fluctuations and the ground fluctuations effectively reduce the available power supply voltage for the digital logic, potentially causing improper operation of the digital logic. In addition, these current spikes can excite a resonance between a capacitance and an inductance within the power supply network and/or the ground network, further reducing the available power supply voltage within the digital integrated circuit when the resonance accumulates fluctuations from multiple current spikes.

"Decoupling capacitors" that are placed between the power supply network and the ground network provide a low impedance path for the current spikes, and this low impedance path reduces fluctuations and resonance in the power supply and ground networks. However, decoupling capacitors outside the integrated circuit do not prevent fluctuations and resonance in the portion of the power supply and ground networks that is inside the integrated circuit. In addition, decoupling capacitors in the package of the integrated circuit do not prevent fluctuations and resonance in the portion of the power supply and ground network that couples the decoupling capacitors to the digital logic within the integrated circuit.

One or more embodiments of the present invention may address one or more of the above issues.

SUMMARY

In one embodiment, a method of fabricating multiple integrated circuits is provided. Bond pads and land pads are fabricated on a semiconductor wafer. Discrete capacitors are mounted on the semiconductor wafer with a flexible adhesive. The flexible adhesive accommodates a difference in thermal expansion between the discrete capacitors and the semiconductor wafer. The land pads are electrically coupled to the electrodes of the discrete capacitors. The semiconductor wafer is separated into multiple semiconductor dice. The semiconductor dice are mounted in respective packages. The bond pads on each semiconductor die are electrically coupled to the interconnect terminals of the respective package.

In another embodiment, an integrated circuit is provided. The integrated circuit includes a semiconductor die, at least one discrete capacitor, and two electrodes for each discrete capacitor. The integrated circuit also includes, for each discrete capacitor, two flexible adhesive connections between the discrete capacitor and respective electrodes for the discrete capacitor. The flexible adhesive connections accommodate a difference in thermal expansion between the discrete capacitor and the semiconductor die. Bond pads and land pads of the integrated circuit are disposed on the semiconductor die, and the land pads include two land pads for each discrete capacitor. The integrated circuit also includes, for each discrete capacitor, two solder connections between the two electrodes for the discrete capacitor and the two land pads for the discrete capacitor. A package arrangement of the integrated circuit electrically couples the bond pads to the interconnect terminals of the package arrangement.

Another integrated circuit is provided in yet another embodiment. This integrated circuit includes a semiconductor die, at least one discrete capacitor, and two electrodes disposed on each discrete capacitor. The integrated circuit also includes, for each discrete capacitor, a flexible adhesive connection between the discrete capacitor and the semiconductor die. The flexible adhesive connection accommodates a difference in thermal expansion between the discrete capacitor and the semiconductor die. Bond pads and land pads of the integrated circuit are disposed on the semiconductor die, and the land pads include two land pads for each discrete capacitor. The integrated circuit also includes, for each discrete capacitor, two wire bond connections between the two electrodes for the discrete capacitor and the two land pads for the discrete capacitor. A package arrangement of the integrated circuit electrically couples the bond pads to the interconnect terminals of the package arrangement.

It will be appreciated that various other embodiments are set forth in the Detailed Description and Claims, which follow.

BRIEF DESCRIPTION OF THE DRAWINGS

Various aspects and advantages of the disclosed embodiments will become apparent upon review of the following detailed description and upon reference to the drawings, in which.

DETAILED DESCRIPTION

One or more embodiments provide decoupling capacitors or other discrete components mounted on the semiconductor die of the integrated circuit. This approach shortens the distance between the decoupling capacitors and the switching circuits in the semiconductor die. Because the distance between the decoupling capacitor and the switching circuits is very short, the inductance between the decoupling capacitor and the switching circuits is very small. The inductance is about thirty pH in certain embodiments with the capacitors mounted on the semiconductor die with flexible adhesive and solder connections, and the inductance is about fifty pH in certain embodiments with the capacitors mounted on the semiconductor die with flexible adhesive and wire bonds.

The reduced inductance between the decoupling capacitors and the switching circuits enables the decoupling capacitors to reduce fluctuations and resonance throughout the power supply and ground networks.

Unfortunately, the semiconductor die and the discrete components generally have different coefficients of thermal expansion. For example, a silicon die has a coefficient of thermal expansion of approximately three ppm per degree Celsius, and a typical dielectric material of a capacitor has a coefficient of thermal expansion of approximately nine ppm per degree Celsius. Because of this difference in thermal expansion, the discrete components, the semiconductor die, or the connection between them can fracture under thermal-mechanical stresses. Therefore, discrete components are mounted on a semiconductor wafer or die using a flexible adhesive that flexes to accommodate the difference in thermal expansion between the discrete component and the semiconductor wafer or die.

Figure 1:
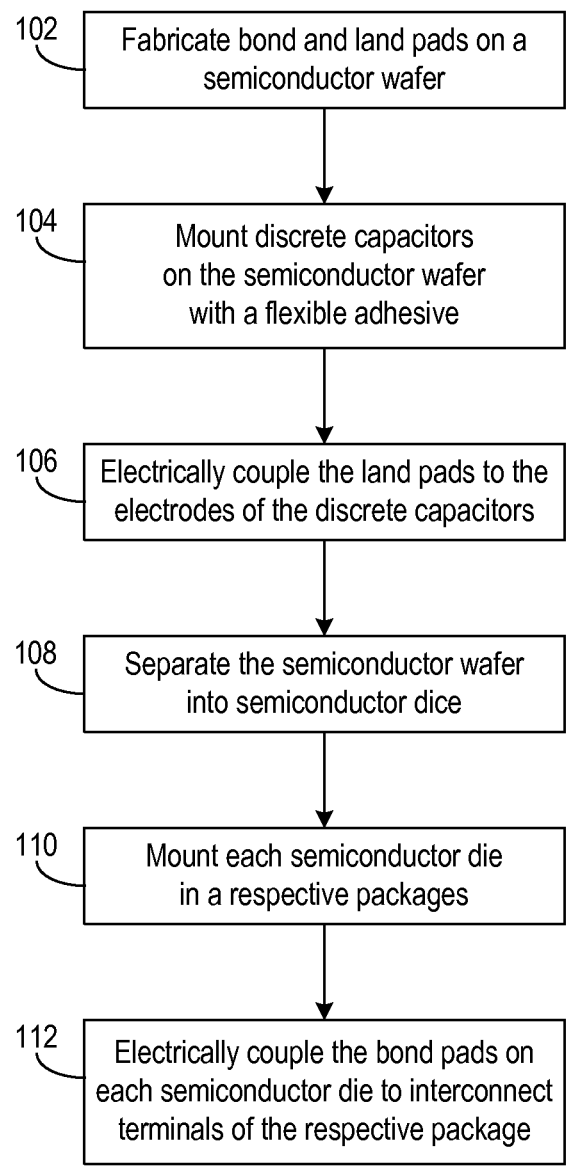
FIG. 1 is a flow diagram of a method of fabricating integrated circuits.

FIG. 1 is a flow diagram of a method of fabricating integrated circuits in accordance with one or more embodiments. Multiple semiconductor dice are fabricated together on a semiconductor wafer, and discrete components, such as a decoupling capacitors for a power supply, are mounted on the wafer's semiconductor dice. The semiconductor dice are separated and individually packaged to form multiple integrated circuits.

At block 102, bond pads and land pads are fabricated on the semiconductor wafer. The bond pads couple the semiconductor dice to respective packages, and the land pads couple the discrete components to the semiconductor dice.

At block 104, discrete capacitors are mounted on the semiconductor wafer with a flexible adhesive, such as epoxy. The flexible adhesive provides a flexible mechanical connection that accommodates a difference in thermal expansion between the discrete capacitors and the semiconductor wafer. In one embodiment, the flexible adhesive is a non-conductive adhesive providing the flexible mechanical connection. In another embodiment, the flexible adhesive is a conductive adhesive providing the flexible mechanical connection and an electrical connection too.

At block 106, the land pads are electrically coupled to the electrodes of the discrete capacitors. Each discrete capacitor usually has two electrodes that are coupled to corresponding land pads.

At block 108, the semiconductor wafer is separated into multiple semiconductor dice. At block 110, the semiconductor dice are mounted in respective packages. At block 112, the bond pads on each semiconductor die are electrically coupled to interconnect terminals of the respective package.

Figure 2:
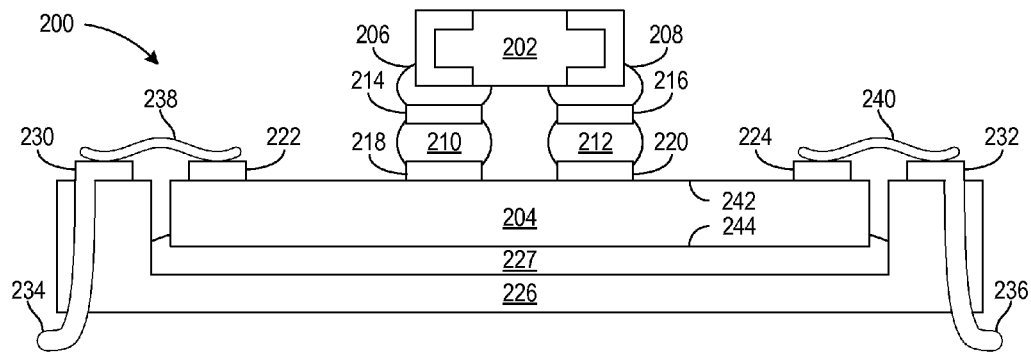
FIG. 2 is a section through a first integrated circuit including a discrete capacitor.

FIG. 2 is a section through a first integrated circuit 200 including a discrete capacitor 202 in accordance with one or more embodiments. The discrete capacitor 202 is mounted on the semiconductor die 204 with flexible adhesive connections 206 and 208 and solder connections 210 and 212.

The integrated circuit 200 includes semiconductor die 204, discrete capacitor 202, two electrodes 214 and 216 for the discrete capacitor 202, two flexible adhesive connections 206 and 208 for the discrete capacitor 202, two land pads 218 and 220 for the discrete capacitor 202, two solder connections 210 and 212 for the discrete capacitor 202, multiple bond pads 222 and 224, and a package arrangement 226.

The flexible adhesive connections 206 and 208 between the discrete capacitor 202 and the electrodes 214 and 216 mechanically accommodate a difference in thermal expansion between the discrete capacitor 202 and the semiconductor die 204. In addition, the flexible adhesive connection 206 electrically couples the discrete capacitor 202 and the electrode 214, and the flexible adhesive connection 208 electrically couples the discrete capacitor 202 the electrode 216.

The solder connection 210 mechanically and electrically couples the electrode 214 and the land pad 218, and the solder connection 212 mechanically and electrically couples the electrode 216 and the land pad 220.

In one embodiment, the two solder connections 210 and 212 for discrete capacitor 202 are flexible solder connections containing at least ninety percent lead. The solder connections 210 and 212 generally contain less than five percent tin because tin makes solder inflexible. The flexible solder connections 210 and 212 in this embodiment further accommodate the difference in thermal expansion between the discrete capacitor 202 and the semiconductor die 204.

The bond pads 222 and 224 and the land pads 218 and 220 are disposed on the front surface 242 of the semiconductor die 204 in the illustrated embodiment. The package arrangement 226 provides an adhesive connection 227 adhering a back surface 244 of the semiconductor die 204 to the package arrangement 226.

In one embodiment, package arrangement 226 includes alternating dielectric and metal layers, and wiring connections in the metal layers electrically couple package pads 230 and 232 to interconnect terminals 234 and 236, respectively. The package arrangement 226 also includes wire bond connections 238 and 240. Wire bond connection 238 electrically couples bond pad 222 and interconnect terminal 234 via package pad 230, and wire bond connection 240 electrically couples bond pad 224 and interconnect terminal 236 via package pad 232.

In one embodiment, the interconnect terminals 234 and 236, the package pads 230 and 232, the wire bond connections 238 and 240, and the bond pads 222 and 224 are part of the power supply network and the ground network decoupled by capacitor 202. In another embodiment, the interconnect terminals 234 and 236, the package pads 230 and 232, the wire bond connections 238 and 240, and the bond pads 222 and 224 provide two input/output signals of the integrated circuit 200, and the power supply and ground networks include additional interconnect terminals, et cetera, that are not shown in the section of FIG. 2.

Figure 3:
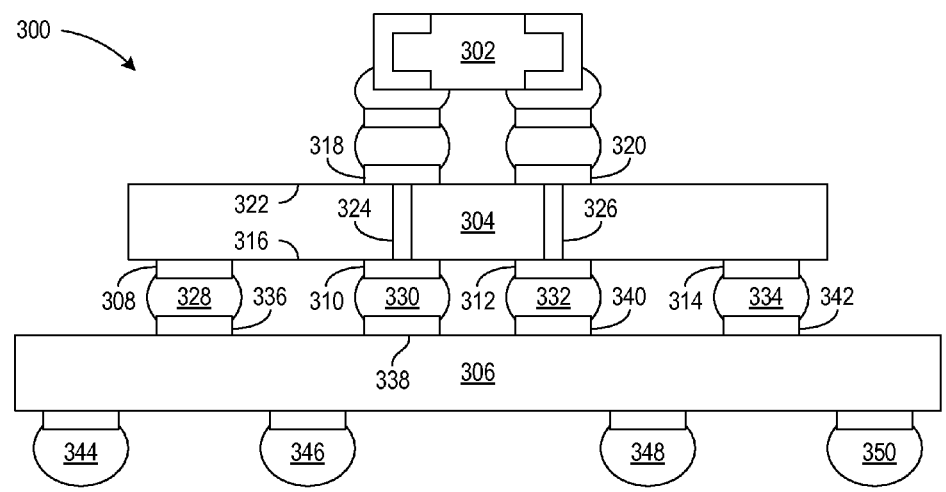
FIG. 3 is a section through a second integrated circuit including a discrete capacitor.

FIG. 3 is a section through a second integrated circuit 300 including a discrete capacitor 302 in accordance with one or more embodiments. The discrete capacitor 302 is mounted on semiconductor die 304 in a manner similar to FIG. 2; however, semiconductor die 304 is mounted in package arrangement 306 in a different manner.

The bond pads 308, 310, 312, and 314 are disposed on the front surface 316 of the semiconductor die 304. The transistors of the switching circuits of integrated circuit 300 are disposed at the front surface 316 in a flip-chip arrangement. The land pads 318 and 320 for discrete capacitor 302 are disposed on the back surface 322 of the semiconductor die 304. The land pads 318 and 320 on the back surface 322 are electrically coupled to the front surface 316 by through-semiconductor vias 324 and 326. In one embodiment, through-semiconductor via 324 electrically couples land pad 318 to bond pad 310, and the through-semiconductor via 326 electrically couples the land pad 320 and the bond pad 312.

The package arrangement 306 includes solder connections 328, 330, 332, and 334 between respective bond pads 308, 310, 312, and 314 and respective package pads 336, 338, 340, and 342. The package arrangement 306 also includes wiring connections (not shown) between the package pads 336, 338, 340, and 342 and the interconnect terminals 344, 346, 348, and 350. In one embodiment, the interconnect terminals 344, 346, 348, and 350 are solder balls of a ball grid array.

Figure 4:
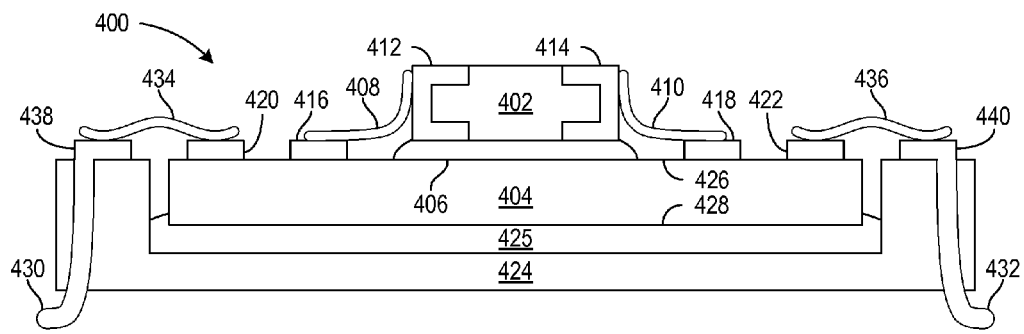
FIG. 4 is a section through a third integrated circuit including a discrete capacitor.

FIG. 4 is a section through a third integrated circuit 400 including a discrete capacitor 402 in accordance with one or more embodiments. The discrete capacitor 402 is mounted on the semiconductor die 404 with flexible adhesive connection 406 and wire bond connections 408 and 410.

The integrated circuit 400 includes the semiconductor die 404, the discrete capacitor 402, two electrodes 412 and 414 of the discrete capacitor 402, the flexible adhesive connection 406 for the discrete capacitor 402, two land pads 416 and 418 for the discrete capacitor 402, two wire bond connections 408 and 410 for the discrete capacitor 402, multiple bond pads 420 and 422, and a package arrangement 424.

The flexible adhesive connection 406 between the discrete capacitor 402 and the semiconductor die 404 mechanically accommodates a difference in thermal expansion between the discrete capacitor 402 and the semiconductor die 404. In one embodiment, the flexible adhesive connection 406 is not electrically conductive to prevent shorting electrodes 412 and 414 together.

The two electrodes 412 and 414 are disposed on the discrete capacitor 402. The bond pads 420 and 422 and the land pads 416 and 418 are disposed on a front surface 426 of the semiconductor die 404.

The wire bond connection 408 electrically couples the electrode 412 and the land pad 416, and the wire bond connection 410 electrically couples the electrode 414 and the land pad 418. Under thermal-mechanical stresses cause by the difference in thermal expansion between discrete capacitor 402 and semiconductor die 404, the wire bond connections 408 and 410 bend to accommodate this difference in thermal expansion. An example of flexible wire bonds is gold wire bonds. The flexible adhesive connection 406 provides the primary mechanical connection between the discrete capacitor 402 and semiconductor die 404.

The package arrangement 424 electrically couples the bond pads 420 and 422 to respective interconnect terminals 430 and 432. The package arrangement 424 includes an adhesive connection 425 adhering a back surface 428 of the semiconductor die 404 to the package arrangement 424. The package arrangement 424 also includes wire bond connections 434 and 436, package pads 438 and 440, and interconnect terminals 430 and 432. Wire bond connection 434 electrically couples bond pad 420 to interconnect terminal 430 via package pad 438, and wire bond connection 436 electrically couples bond pad 422 to interconnect terminal 432 via package pad 440.

Figure 5:
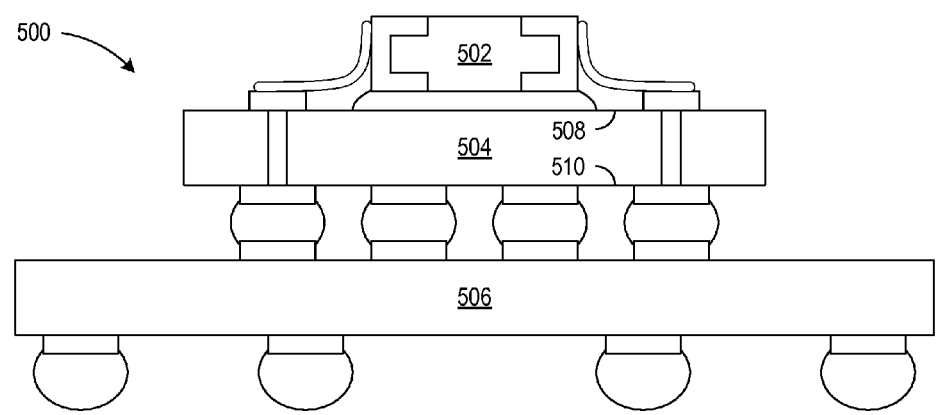
FIG. 5 is a section through a fourth integrated circuit including a discrete capacitor.

FIG. 5 is a section through a fourth integrated circuit 500 including a discrete capacitor 502 in accordance with one or more embodiments. The discrete capacitor 502 is mounted on a back surface 508 of semiconductor die 504 in a manner similar to FIG. 4, and the semiconductor die 504 is mounted in package arrangement 506 in a manner similar to FIG. 3.

Figure 6:
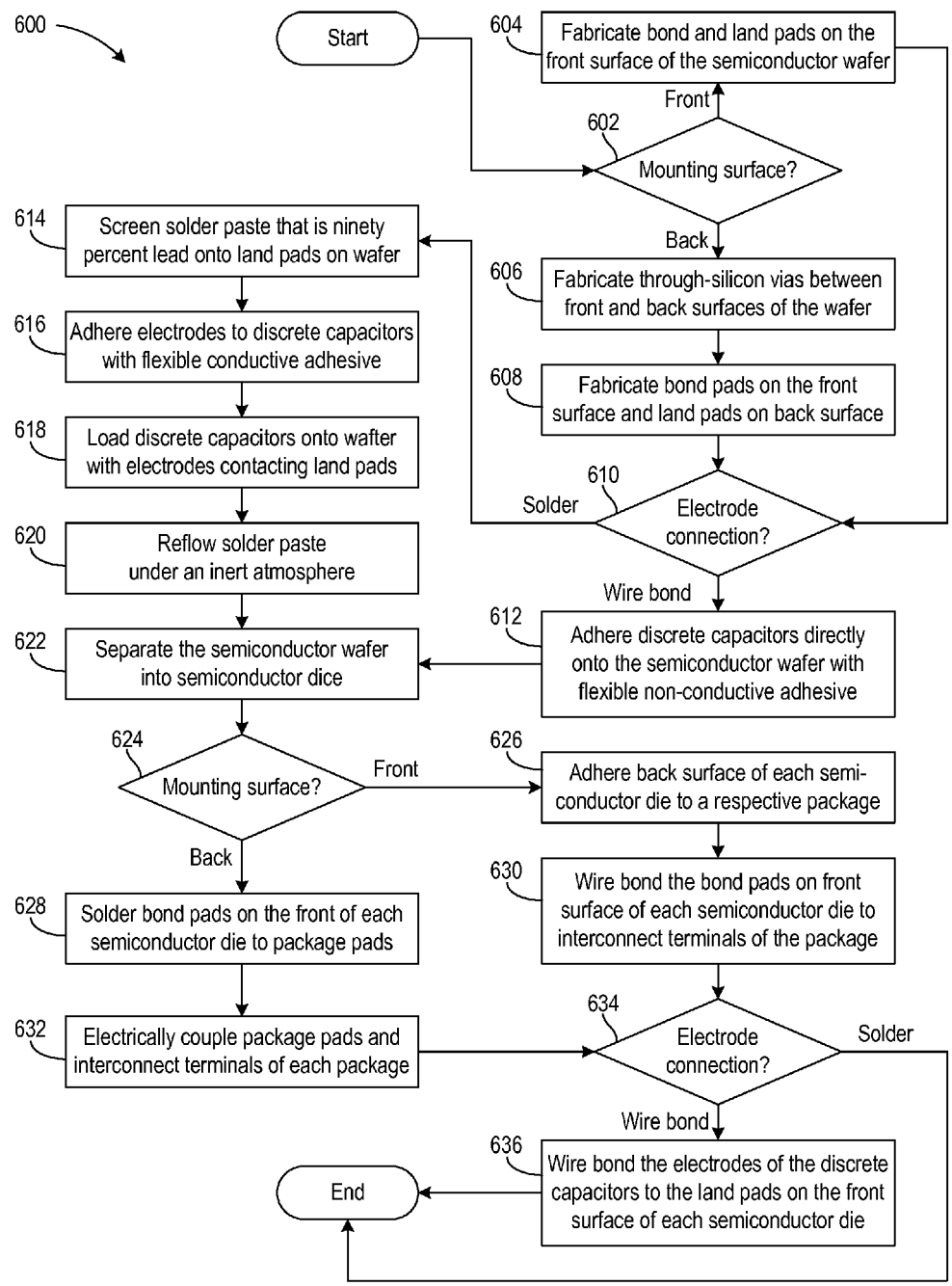
FIG. 6 is a flow diagram of another method of fabricating integrated circuits.

FIG. 6 is a flow diagram of another method 600 of fabricating integrated circuits in accordance with one or more embodiments. The method 600 packages discrete components and semiconductor dice from a semiconductor wafer to produce multiple integrated circuits corresponding to any of FIG. 2, 3, 4, or 5, for example. In one embodiment, the discrete component is a decoupling capacitor for the power supply and ground networks of the integrated circuits.

Decision block 602 checks whether the discrete components are mounted on the front surface or on the back surface using through-semiconductor vias. When the discrete components are mounted on the front surface using wire-bond packaging as shown in FIGS. 2 and 4, process 600 proceeds to step 604; otherwise, when the discrete components are mounted on the back surface using through-semiconductor vias and flip-chip packaging as shown in FIGS. 3 and 5, process 600 proceeds to block 606.

At block 604 for front surface mounting, the bond pads and the land pads are fabricated on the front surface of the semiconductor wafer.

At block 606 for back surface mounting, through-semiconductor vias are fabricated between the front and back surfaces of the semiconductor wafer. At block 608, the bond pads are fabricated on the front surface of the semiconductor wafer and the land pads are fabricated on the back surface of the semiconductor wafer. The land pads on the back surface are electrically coupled to the front surface of the semiconductor wafer through respective through-semiconductor vias.

Decision block 610 checks whether the discrete components are electrically coupled to the land pads using wire bonds or solder connections. When wire bonds electrically couple the electrodes of the discrete components and the land pads on the semiconductor wafer as shown in FIGS. 4 and 5, process 600 proceeds to block 612; otherwise, when solder connections electrically couple the electrodes of the discrete components and the land pads on the semiconductor wafer as shown in FIGS. 2 and 3, process 600 proceeds to block 614.

At block 612, a flexible adhesive adheres the discrete components onto the semiconductor wafer. In one embodiment, the discrete components directly adhere onto the semiconductor wafer with the flexible adhesive which is not electrically conductive.

For solder connections, the electrodes on the discrete components are soldered to the land pads. At block 614, solder paste is deposited onto the land pads on the semiconductor wafer using a screening process. In one embodiment, the solder paste contains at least ninety percent lead and less than five percent flux to form flexible solder connections. At block 616, a flexible and electrically conductive adhesive mounts the electrodes on the discrete components. An example flexible and electrically conductive adhesive is silver filled epoxy. At block 618, the discrete components are loaded onto the semiconductor wafer with the electrodes contacting the land pads. At block 620, the solder paste is reflowed under an inert atmosphere to form solder connections between the electrodes and the land pads.

At block 622, the semiconductor wafer is separated into multiple semiconductor dice. In one embodiment, a wafer saw cuts the semiconductor dice from the semiconductor wafer. The front surface of the semiconductor wafer becomes the front surface of each semiconductor die, and the back surface of the semiconductor wafer becomes the back surface of each semiconductor die.

Decision block 624 again checks whether the discrete components are mounted on the front or back surface of the semiconductor die. Decision block 624 should parallel decision block 602. For front surface mounting, process 600 proceeds to step 626; otherwise for back surface mounting, process 600 proceeds to block 628.

At block 626, the back surface of each semiconductor die is adhered to a respective package. At block 630, the bond pads on the front surface of each semiconductor die are wire bonded to the interconnect terminals of the respective package. In one embodiment, the bond pads are wire bonded to package pads that are electrically coupled to the interconnect terminals.

At block 628, the bond pads on the front surface of each semiconductor die are soldered to package pads on the respective package. At block 632, the package pads are electrically coupled to the interconnect terminals of the respective package.

Decision block 634 again checks whether the discrete components are electrically coupled to the land pads using wire bonds or solder connections. Decision block 634 should parallel decision block 610. For wire bonds, process 600 proceeds to block 636; otherwise process 600 is complete. At block 636, the electrodes of the discrete components are wire bonded to the land pads.

The embodiments of the present invention are thought to be applicable to a variety of methods and systems for mounting discrete capacitors on fabricated integrated circuits. Other aspects and embodiments will be apparent to those skilled in the art from consideration of the specification. It is intended that the specification and illustrated embodiments be considered as examples only, with a true scope and spirit of the invention being indicated by the following claims.

What is claimed is:

1. An integrated circuit, comprising:
    a semiconductor die;
    wherein the semiconductor die has first and second surfaces;
    at least one discrete capacitor mounted on the semiconductor die;
    wherein the at least one discrete capacitor is mounted on the first surface of the semiconductor die;
    two electrodes for each discrete capacitor;
    two flexible adhesive connections for each discrete capacitor, each of the two flexible adhesive connections connecting the discrete capacitor to one of the two electrodes for the discrete capacitor;
    wherein the two flexible adhesive connections accommodate a difference in thermal expansion between the discrete capacitor and the semiconductor die;
    a plurality of bond pads and a plurality of land pads disposed on the semiconductor die, wherein the land pads include two land pads for each discrete capacitor;
    two solder connections for each discrete capacitor, each of the two solder connections connected to, and between, one of the two electrodes for the discrete capacitor and one of the two land pads for the discrete capacitor; and
    a package arrangement electrically coupling the plurality of bond pads to a plurality of interconnect terminals of the package arrangement;
    wherein the package arrangement is attached to the semiconductor die at the second surface of the semiconductor die.

2. The integrated circuit of claim 1, wherein:
    the two solder connections for each discrete capacitor are flexible solder connections containing at least ninety percent lead; and
    the two solder connections further accommodate the difference in thermal expansion between the discrete capacitor and the semiconductor die.

3. The integrated circuit of claim 1, wherein:
    the plurality of bond pads and the plurality of land pads are disposed on a front surface of the semiconductor die; and
    the package arrangement includes:
        an adhesive connection adhering a back surface of the semiconductor die to the package arrangement; and
        a plurality of wire bond connections that electrically couple the plurality of bond pads to the plurality of interconnect terminals of the package arrangement.

4. The integrated circuit of claim 1, further comprising a plurality of through-semiconductor vias between a front and back surface of the semiconductor die, wherein:
    the plurality of bond pads are disposed on the front surface of the semiconductor die and the plurality of land pads are disposed on the back surface of the semiconductor die; and
    the plurality of land pads on the back surface are electrically coupled to the front surface through respective ones of the plurality of through-semiconductor vias.

5. The integrated circuit of claim 4, wherein the package arrangement includes:
    a plurality of solder connections that connect the plurality of bond pads on the front surface of the semiconductor die to a plurality of pads of the package arrangement; and
    a plurality of electrical connections that connect the plurality of pads of the package arrangement to the plurality of interconnect terminals of the respective package.

6. The integrated circuit of claim 1, wherein each of the two solder connections is disposed on the one of the two land pads.

7. An integrated circuit, comprising:
    a semiconductor die;
    wherein the semiconductor die has first and second surfaces;
    at least one discrete capacitor mounted on the semiconductor die;
    wherein the at least one discrete capacitor is mounted on the first surface of the semiconductor die;
    two electrodes for each discrete capacitor, the two electrodes disposed on the discrete capacitor;
    a flexible adhesive connection for each discrete capacitor, the flexible adhesive connection connecting the discrete capacitor to the semiconductor die;
    wherein the flexible adhesive connection accommodates a difference in thermal expansion between the discrete capacitor and the semiconductor die;
    a plurality of bond pads and a plurality of land pads disposed on the semiconductor die, wherein the plurality of land pads include two land pads for each discrete capacitor;
    two wire bond connections for each discrete capacitor, the two wire bond connections connecting the two electrodes for the discrete capacitor to the two land pads for the discrete capacitor; and
    a package arrangement electrically coupling the plurality of bond pads to a plurality of interconnect terminals of the package arrangement;
    wherein the package arrangement is attached to the semiconductor die at the second surface of the semiconductor die.

8. The integrated circuit of claim 7, wherein the flexible adhesive connection for each discrete capacitor is not electrically conductive.

9. The integrated circuit of claim 7, wherein the two wire bond connections for each discrete capacitor are flexible to accommodate the difference in thermal expansion between the discrete capacitor and the semiconductor die.

10. The integrated circuit of claim 7, wherein:
    the plurality of bond pads and the plurality of land pads are disposed on a front surface of the semiconductor die; and
    the package arrangement includes:
        an adhesive connection adhering a back surface of the semiconductor die to the package arrangement; and
        a plurality of wire bond connections that electrically couple the plurality of bond pads to the interconnect terminals of the package arrangement.

11. The integrated circuit of claim 7, further comprising a plurality of through-semiconductor vias between a front and back surface of the semiconductor die, wherein:
- the plurality of bond pads are disposed on the front surface of the semiconductor die and the plurality of land pads are disposed on the back surface of the semiconductor die; and
- the plurality of land pads on the back surface are electrically coupled to the front surface through respective ones of the plurality of through-semiconductor vias.

12. The integrated circuit of claim 11, wherein the package arrangement includes:
- a plurality of solder connections between the plurality of bond pads on the front surface of the semiconductor die and a plurality of pads of the package arrangement; and
- a plurality of electrical connections between the plurality of pads of the respective package to the plurality of interconnect terminals of the respective package.

\* \* \* \* \*